(12) United States Patent
Hrach et al.

(10) Patent No.: US 10,018,122 B2
(45) Date of Patent: Jul. 10, 2018

(54) PRESSURE SENSOR NOISE FILTER PRIOR TO SURGE DETECTION FOR A GAS TURBINE ENGINE

(71) Applicant: UNITED TECHNOLOGIES CORPORATION, Hartford, CT (US)

(72) Inventors: Michael Hrach, West Hartford, CT (US); Andrew Brehm, West Hartford, CT (US)

(73) Assignee: United Technologies Corporation, Farmington, CT (US)

( * ) Notice: Subject to any disclaimer, the term of this patent is extended or adjusted under 35 U.S.C. 154(b) by 336 days.

(21) Appl. No.: 14/773,838

(22) PCT Filed: Jan. 13, 2014

(86) PCT No.: PCT/US2014/011269
§ 371 (c)(1),
(2) Date: Sep. 9, 2015

(87) PCT Pub. No.: WO2014/158307
PCT Pub. Date: Oct. 2, 2014

(65) Prior Publication Data
US 2016/0040604 A1    Feb. 11, 2016

Related U.S. Application Data

(60) Provisional application No. 61/782,818, filed on Mar. 14, 2013.

(51) Int. Cl.
*G05B 13/00* (2006.01)
*G05D 7/00* (2006.01)
(Continued)

(52) U.S. Cl.
CPC ............... *F02C 9/18* (2013.01); *F02C 9/00* (2013.01); *F02C 9/263* (2013.01); *F02C 9/28* (2013.01);
(Continued)

(58) Field of Classification Search
CPC ..................................................... G05B 15/02
(Continued)

(56) References Cited

U.S. PATENT DOCUMENTS 3,868,625 A    2/1975 Speigner et al.
4,096,989 A    6/1978 Tawfik
(Continued)

FOREIGN PATENT DOCUMENTS

EP    0051003 A2    5/1982
WO    WO9634207    10/1996

OTHER PUBLICATIONS

European Extended Search Report dated Oct. 18, 2016, issued in the corresponding European Patent Application No. 14775200.0.

*Primary Examiner* — Suresh Suryawanshi
(74) *Attorney, Agent, or Firm* — Bachman & LaPointe, P.C.

(57) ABSTRACT

A filter algorithm for a dual channel electronic engine control system according to one disclosed non-limiting embodiment of the present disclosure includes a division function that divides a measured pressure rate of change of one of a FADEC channel A and FADEC channel B by an average pressure of the FADEC channel A and the FADEC channel B to obtain a resultant value; a first comparator function to bound a proper high resultant value from the division function; a second comparator function to bound a proper low resultant value from the division function; and an OR gate in communication with the first comparator and the second comparator such that if an output from either the first (Continued)

comparator function and the second comparator function is true, that one of the FADEC channel A and the FADEC channel B is filtered out for a time period.

19 Claims, 3 Drawing Sheets

(51) Int. Cl.
    *G06F 19/00* (2018.01)
    *F02C 9/18* (2006.01)
    *F02C 9/00* (2006.01)
    *F02C 9/28* (2006.01)
    *F02C 9/26* (2006.01)
    *G05B 15/02* (2006.01)
    *H03H 7/01* (2006.01)
    *G05B 9/03* (2006.01)

(52) U.S. Cl.
    CPC ............ *G05B 9/03* (2013.01); *G05B 15/02* (2013.01); *H03H 7/01* (2013.01); *F05D 2200/14* (2013.01); *F05D 2200/33* (2013.01); *F05D 2220/32* (2013.01); *F05D 2240/20* (2013.01); *F05D 2240/35* (2013.01); *F05D 2260/84* (2013.01); *F05D 2260/96* (2013.01); *F05D 2270/101* (2013.01); *F05D 2270/301* (2013.01); *F05D 2270/309* (2013.01); *F05D 2270/54* (2013.01); *F05D 2270/70* (2013.01)

(58) Field of Classification Search
    USPC .......................................................... 700/275
    See application file for complete search history.

(56) References Cited

U.S. PATENT DOCUMENTS

| | | | | |
|---|---|---|---|---|
| 4,507,915 A * | 4/1985 | Evans | ........................ | F02C 9/28 60/39.281 |
| 4,655,034 A * | 4/1987 | Kenison | .................... | F02C 9/18 415/27 |
| 5,012,637 A | 5/1991 | Dubin et al. | | |
| 5,726,891 A * | 3/1998 | Sisson | .................... | F04D 27/001 415/17 |
| 5,752,379 A * | 5/1998 | Schafer | ................. | F04D 27/001 60/39.24 |
| 5,798,941 A * | 8/1998 | McLeister | .............. | G05B 11/42 415/1 |
| 6,059,522 A * | 5/2000 | Gertz | ...................... | F02C 7/057 415/1 |
| 6,231,306 B1 * | 5/2001 | Khalid | .................... | F01D 17/08 415/118 |
| 6,513,333 B2 * | 2/2003 | Sugitani | ................... | F02C 9/28 60/39.27 |
| 6,536,284 B2 | 3/2003 | Bonanni | | |
| 6,823,254 B2 * | 11/2004 | Faymon | .................. | F04D 27/02 701/100 |
| 7,065,973 B2 * | 6/2006 | Rowe | ...................... | F02C 7/262 60/39.281 |
| 7,530,260 B2 * | 5/2009 | Dooley | .................. | F02C 7/232 73/112.06 |
| 2001/0045088 A1 | 11/2001 | Sugitani | | |
| 2004/0193355 A1 | 9/2004 | Faymon et al. | | |
| 2006/0112697 A1 | 6/2006 | Rowe | | |

* cited by examiner

PRESSURE SENSOR NOISE FILTER PRIOR TO SURGE DETECTION FOR A GAS TURBINE ENGINE

Applicant hereby claims priority to U.S. Patent Application No. 61/782,818 filed Mar. 14, 2013, the disclosure of which is herein incorporated by reference.

STATEMENT REGARDING FEDERALLY SPONSORED RESEARCH OR DEVELOPMENT

This disclosure was made with Government support under N00019-02-C-3003 awarded by The United States Air Force. The Government has certain rights in this disclosure.

BACKGROUND

The present disclosure relates to a gas turbine engine and, more particularly, to a pressure spike filter algorithm therefor.

Gas turbine engines may include a Full Authority Digital Engine Control (FADEC) system that controls aspects of engine performance to allow the engine to perform at maximum efficiency for a given condition. The FADEC system also detects transient conditions such as an engine surge and triggers appropriate operational responses such as a surge recovery sequence to temporarily reduce engine thrust to facilitate clearance of the surge. False pressure sensor indications which result in unneeded operational responses that reduce engine thrust may complicate some aircraft operations and should be minimized.

SUMMARY

A filter algorithm for a dual channel electronic engine control system according to one disclosed non-limiting embodiment of the present disclosure includes a division function that divides a measured pressure rate of change of one of a FADEC channel A and FADEC channel B by an average pressure of the FADEC channel A and the FADEC channel B to obtain a resultant value; a first comparator function to bound a proper high resultant value from the division function; a second comparator function to bound a proper low resultant value from the division function; and an OR gate in communication with the first comparator and the second comparator such that if an output from either the first comparator function and the second comparator function is true, that one of the FADEC channel A and the FADEC channel B is filtered out for a time period.

A further embodiment of the present disclosure includes, wherein the measured pressure rate of change is measured by a digital pressure sensor on each of the FADEC channel A and the FADEC channel B.

A further embodiment of any of the foregoing embodiments of the present disclosure includes, wherein the digital pressure sensor on each of the FADEC channel A and the FADEC channel B is in communication with a fan section of a gas turbine engine.

A further embodiment of any of the foregoing embodiments of the present disclosure includes, wherein the digital pressure sensor on each of the FADEC channel A and the FADEC channel B is in communication with a compressor section of a gas turbine engine.

A further embodiment of any of the foregoing embodiments of the present disclosure includes, wherein the digital pressure sensor on each of the FADEC channel A and the FADEC channel B is in communication with a combustor section of a gas turbine engine.

A further embodiment of any of the foregoing embodiments of the present disclosure includes, wherein the digital pressure sensor on each of the FADEC channel A and the FADEC channel B is in communication with a turbine section of a gas turbine engine.

A further embodiment of any of the foregoing embodiments of the present disclosure includes, wherein the digital pressure sensor on each of the FADEC channel A and the FADEC channel B is in communication with an augmentor section of a gas turbine engine.

A further embodiment of any of the foregoing embodiments of the present disclosure includes, wherein the digital pressure sensor on each of the FADEC channel A and the FADEC channel B is in communication with an exhaust duct section of a gas turbine engine.

A further embodiment of any of the foregoing embodiments of the present disclosure includes, wherein the digital pressure sensor on each of the FADEC channel A and the FADEC channel B is in communication with a nozzle system of a gas turbine engine.

A further embodiment of any of the foregoing embodiments of the present disclosure includes, wherein the digital pressure sensor on each of the FADEC channel A and the FADEC channel B is in communication with a two-spool low-bypass augmented turbofan gas turbine engine.

A method for filtering a dual channel electronic engine control system according to another disclosed non-limiting embodiment of the present disclosure includes dividing a measured pressure rate of change of one of a channel A and B by an average pressure of channel A and B to obtain a resultant value; and comparing the resultant value to a proper high resultant value and a proper low resultant value such that if either is true, filtering out that channel for a time period.

A further embodiment of any of the foregoing embodiments of the present disclosure includes defining the time period as 0.025 seconds.

A further embodiment of any of the foregoing embodiments of the present disclosure includes measuring the measured pressure rate of change at a section of a two-spool low-bypass augmented turbofan gas turbine engine.

A method of operating a gas turbine engine according to another disclosed non-limiting embodiment of the present disclosure includes filtering an erroneous pressure measurement to avoid triggering a surge recovery sequence.

A further embodiment of any of the foregoing embodiments of the present disclosure includes filtering the erroneous pressure measurement for a time period.

A further embodiment of any of the foregoing embodiments of the present disclosure includes defining the time period as 0.025 seconds.

A further embodiment of any of the foregoing embodiments of the present disclosure includes, wherein filtering an erroneous pressure measurement includes comparing an indication of a false pressure change from a FADEC channel A to a measurement from a FADEC channel B.

A further embodiment of any of the foregoing embodiments of the present disclosure includes filtering an erroneous pressure measurement includes comparing an indication of a false pressure change from a FADEC channel B to a measurement from a FADEC channel A.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

Various features will become apparent to those skilled in the art from the following detailed description of the disclosed non-limiting embodiment. The drawings that accompany the detailed description can be briefly described as follows.

DETAILED DESCRIPTION

Figure 1:
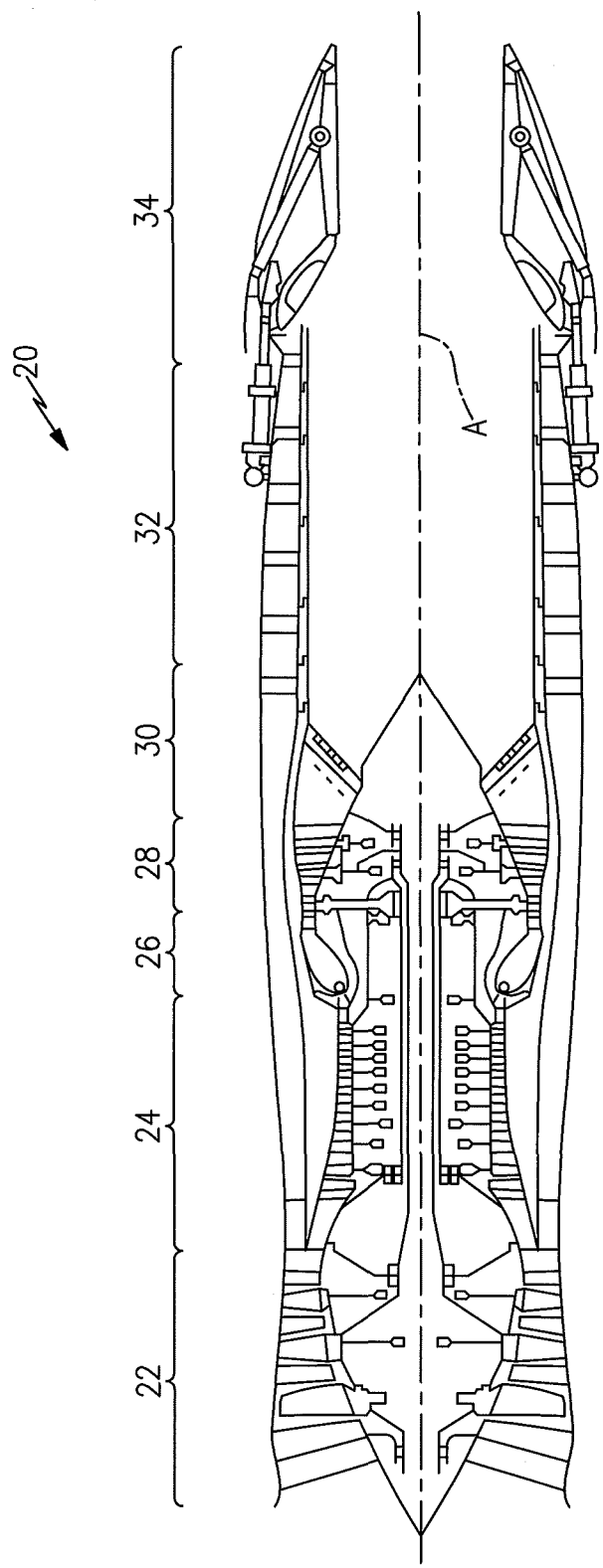
FIG. 1 is a general schematic view of an exemplary gas turbine engine.

FIG. 1 schematically illustrates a gas turbine engine 20. The gas turbine engine 20 is disclosed herein as a two-spool low-bypass augmented turbofan that generally incorporates a fan section 22, a compressor section 24, a combustor section 26, a turbine section 28, an augmenter section 30, an exhaust duct section 32, and a nozzle system 34 along a central longitudinal engine axis A. Although depicted as an augmented low bypass turbofan in the disclosed non-limiting embodiment, it should be understood that the concepts described herein are applicable to other gas turbine engines including non-augmented engines, geared architecture engines, direct drive turbofans, turbojet, turboshaft, multi-stream variable cycle and other engine architectures.

Figure 2:
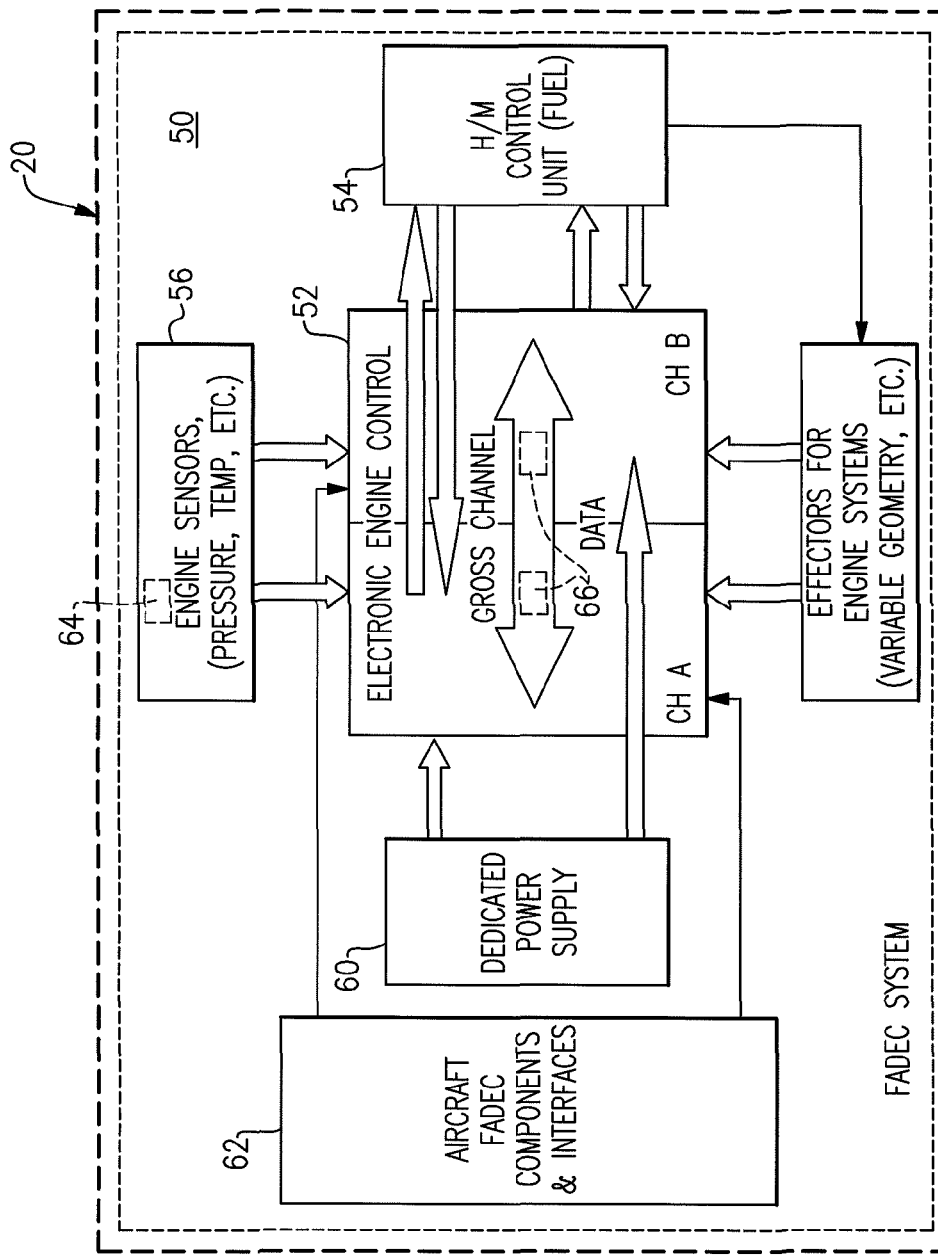
FIG. 2 is a schematic view of a Full Authority Digital Engine Control (FADEC) system.

With reference to FIG. 2, the gas turbine engine 20 includes a Full Authority Digital Engine Control (FADEC) system 50 that includes, among others, an electronic engine control (EEC) unit 52, a fuel metering unit (i.e., hydromechanical control unit) 54, engine sensors 56, effectors for engine systems (variable geometry vanes, etc.) 58, a dedicated power supply 60, FADEC interfaces 62 and others. The FADEC is a dual-channel system with two redundant channels, a first channel A and a second redundant channel B. Channels A and B provide redundancy in the engine control and operation.

At least some of the engine sensors 56 are digital pressure sensors 64 with an A and B channel pressure sensor 64 located in one or more of the various sections of the engine 20 such as, for example, the fan section 22, the compressor section 24, the combustor section 26, the turbine section 28, the augmenter section 30, the exhaust duct section 32, and the nozzle system 34 (FIG. 1). The pressure sensors 64 may be a digital Silicon On Sapphire (SOS) pressure sensor manufactured by ELDEC Corporation of Lynnwood, Wash., USA. Although effective and highly accurate, the digital pressure sensors 64 may be subject to false pressure spike which may be caused by, for example, electromagnetic interference. Unless filtered out, the false pressure spike may be interpreted as a false stall identification by the FADEC system 50 which then may improperly respond with corrective actions to the false stall identification.

The electronic engine control (EEC) unit 52 is a control module that executes a filter algorithm 66 (FIG. 3) to identify and filter out any predetermined unrealistic increase or decrease observed in only one of Channel A and B from, for example, the pressure sensors 64. The functions of the filter algorithm 66 are disclosed in terms of functional block diagram Boolean logic gates, and it should be understood by those skilled in the art with the benefit of this disclosure that these functions may be enacted in either dedicated hardware circuitry or programmed software routines capable of execution in a microprocessor based electronics control embodiment.

The EEC unit 52 generally includes a processor, a memory, and an interface. The processor may be any type of known microprocessor having desired performance characteristics. The memory may be any computer readable medium which stores data and control algorithms such as the filter algorithm 66 as described herein. The interface facilitates communication with other components, systems and subsystems. It should be appreciated that various other components, systems and subsystems may be utilized herewith.

Figure 3:
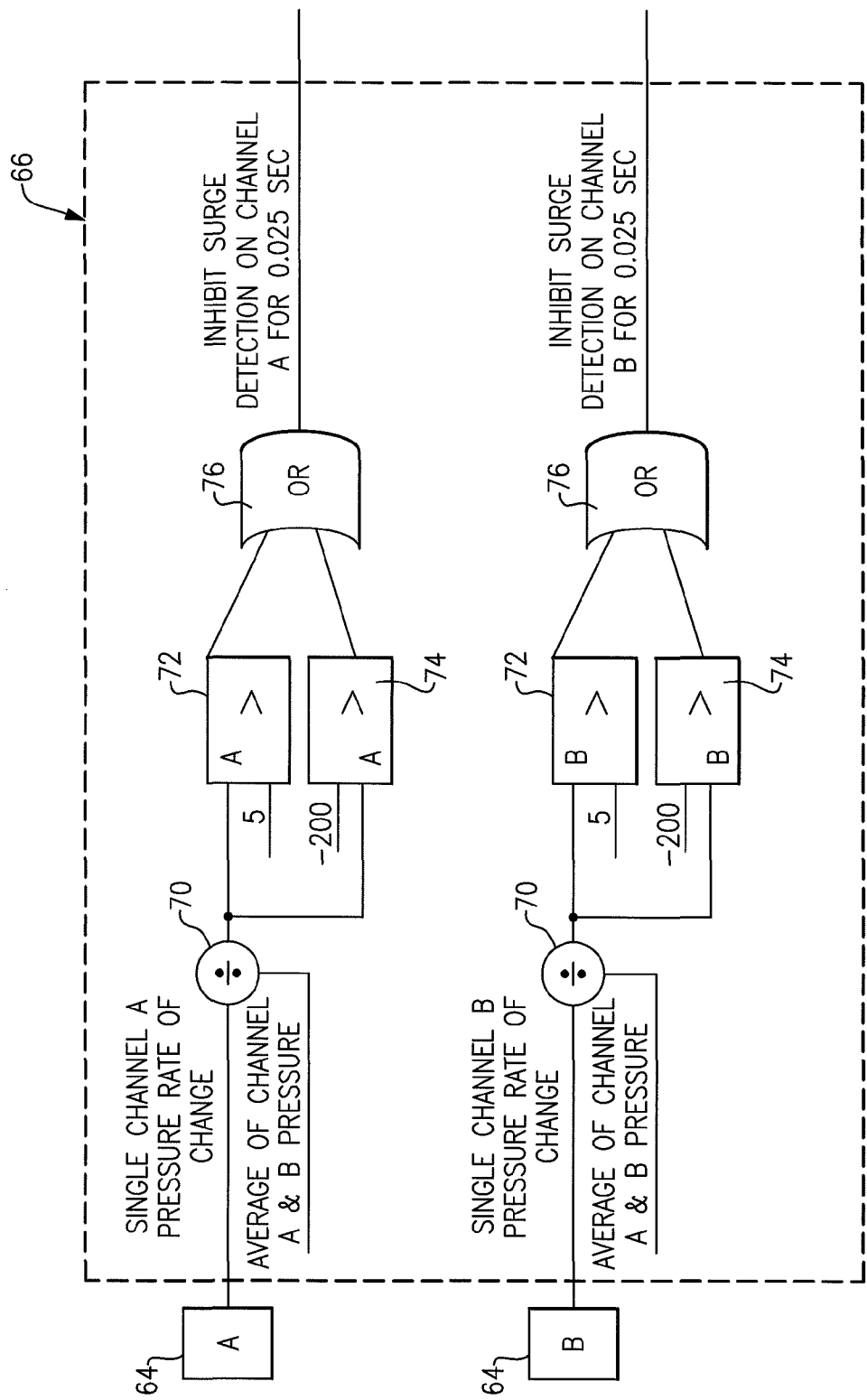
FIG. 3 is a schematic view of a pressure spike filter algorithm for the Full Authority Digital Engine Control (FADEC) system.

With reference to FIG. 3, the filter algorithm 66 is provided for each channel A and B, however, only one need be described in detail herein as each operates essentially equivalently. The filter algorithm 66 initially divides a measured pressure rate of change of each channel A and B {P dot} by an average pressure of channel A and B {P} at a division function 70. As understood dot notation, uses a dot placed over a function name to denote the time derivative of that function. The pressure rate of change is the derivative of a measured pressure as measured by the associated pressure sensor 64.

The resultant from the division function 70 is then split and sent to parallel comparator functions 72, 74. One comparator function 72 bounds a high proper resultant value, for example, five (5). The other comparator function 74 bounds a low proper resultant value, for example, negative two-hundred (−200). The predetermined proper resultant values are represented here as psi dot over psi {psi dot/psi}. It should be appreciated that other predetermined proper resultant values may alternatively be utilized.

The results from the parallel comparator functions 72, 74 are then sent to an OR gate 76 such that if either is true that channel is filtered out for a time period. That is, any value greater than, in this example, above 5 or below −200 sets a true flag to the OR gate 76 such that surge detection on the respective channel A or B is then inhibited for a time period of, for example, 0.025 seconds (25 milliseconds). In the disclosed non-limiting embodiment, 0.025 seconds (25 milliseconds) equates to two (2) passes through the FADEC system 50 as the false pressure spike has been observed to not last for a longer time period. It should be appreciated that other time periods may alternatively be utilized. The FADEC system 50 is thereby spared from improperly triggering corrective actions to the false pressure spike identification.

The filter algorithm 66 thereby discriminates an erroneous pressure measurement from the engine 20 and filters the erroneous pressure measurement so as to avoid triggering the surge recovery sequence that reduces engine thrust and otherwise may complicate some aircraft operations. That is, the pressure spike filter algorithm 66 calculates the change of a single channel pressure from the other channel and if an unrealistic increase or decrease is observed in only one channel, the signal is filtered out and not used to detect a potential engine surge.

The use of the terms "a" and "an" and "the" and similar references in the context of description (especially in the context of the following claims) are to be construed to cover both the singular and the plural, unless otherwise indicated herein or specifically contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other. It should be appreciated that relative positional terms such as "forward," "aft," "upper," "lower," "above," "below," and the like are with reference to the normal operational attitude of the vehicle and should not be considered otherwise limiting.

Although the different non-limiting embodiments have specific illustrated components, the embodiments of this invention are not limited to those particular combinations. It is possible to use some of the components or features from any of the non-limiting embodiments in combination with features or components from any of the other non-limiting embodiments.

It should be appreciated that like reference numerals identify corresponding or similar elements throughout the several drawings. It should also be appreciated that although a particular component arrangement is disclosed in the illustrated embodiment, other arrangements will benefit herefrom.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be appreciated that within the scope of the appended claims, the disclosure may be practiced other than as specifically described. For that reason the appended claims should be studied to determine true scope and content.

What is claimed is:

1. A filter algorithm operating on an electronic engine control (EEC) unit of a Full Authority Digital Engine Control (FADEC) system that controls a gas turbine engine of an aircraft, the filter algorithm, comprising:
   a division function that divides a measured pressure rate of change of one of a FADEC channel A and FADEC channel B by an average pressure of said FADEC channel A and said FADEC channel B to obtain a resultant value, wherein said measured pressure rate of change is measured by a digital pressure sensor on each of said FADEC channel A and said FADEC channel B;
   a first comparator function to bound a proper high resultant value from said division function;
   a second comparator function to bound a proper low resultant value from said division function; and
   an OR gate in communication with said first comparator and said second comparator such that if an output from either said first comparator function and said second comparator function is true, that one of said FADEC channel A and said FADEC channel B is filtered out for a time period to filter an erroneous pressure measurement to avoid triggering a surge recovery sequence.

2. The filtering algorithm as recited in claim 1, wherein said digital pressure sensor on each of said FADEC channel A and said FADEC channel B is in communication with a fan section of a gas turbine engine.

3. The filtering algorithm as recited in claim 1, wherein said digital pressure sensor on each of said FADEC channel A and said FADEC channel B is in communication with a compressor section of a gas turbine engine.

4. The filtering algorithm as recited in claim 1, wherein said digital pressure sensor on each of said FADEC channel A and said FADEC channel B is in communication with a combustor section of a gas turbine engine.

5. The filtering algorithm as recited in claim 1, wherein said digital pressure sensor on each of said FADEC channel A and said FADEC channel B is in communication with a turbine section of a gas turbine engine.

6. The filtering algorithm as recited in claim 1, wherein said digital pressure sensor on each of said FADEC channel A and said FADEC channel B is in communication with an augmentor section of a gas turbine engine.

7. The filtering algorithm as recited in claim 1, wherein said digital pressure sensor on each of said FADEC channel A and said FADEC channel B is in communication with an exhaust duct section of a gas turbine engine.

8. The filtering algorithm as recited in claim 1, wherein said digital pressure sensor on each of said FADEC channel A and said FADEC channel B is in communication with a nozzle system of a gas turbine engine.

9. The filtering algorithm as recited in claim 1, wherein said digital pressure sensor on each of said FADEC channel A and said FADEC channel B is in communication with a two-spool low-bypass augmented turbofan gas turbine engine.

10. A method for filtering an erroneous pressure measurement from a gas turbine engine of an aircraft, comprising:
    dividing a measured pressure rate of change of one of a channel A and B with an electronic engine control (EEC) unit of a Full Authority Digital Engine Control (FADEC) system that controls a gas turbine engine of an aircraft that executes a filter algorithm to filter an erroneous pressure measurement to avoid triggering a surge recovery sequence by an average pressure of channel A and B to obtain a resultant value, wherein said measured pressure rate of change is measured by a digital pressure sensor on each of said FADEC channel A and said FADEC channel B; and
    comparing the resultant value to a proper high resultant value and a proper low resultant value such that if either is true, filtering out that channel for a time period to avoid triggering a surge recovery sequence.

11. The method as recited in claim 8, further comprising: defining the time period as 0.025 seconds.

12. The method as recited in claim 8, further comprising: measuring the measured pressure rate of change at a section of a two-spool low-bypass augmented turbofan gas turbine engine.

13. A method of operating a gas turbine engine comprising:
    filtering an erroneous pressure measurement from a digital pressure sensor on each of a FADEC channel A and a FADEC channel B in an electronic engine control (EEC) unit of a Full Authority Digital Engine Control (FADEC) system that controls the gas turbine engine to avoid triggering a surge recovery sequence for the gas turbine engine.

14. The method as recited in claim 13, further comprising: filtering the erroneous pressure measurement for a time period.

15. The method as recited in claim 14, further comprising: defining the time period as 0.025 seconds.

16. The method as recited in claim 14, wherein filtering an erroneous pressure measurement includes comparing an indication of a false pressure change from the Full Authority Digital Engine Control (FADEC) channel A to the measurement from a FADEC channel B.

17. The method as recited in claim 14, wherein filtering an erroneous pressure measurement includes comparing an indication of a false pressure change from the Full Authority Digital Engine Control (FADEC) channel B to the measurement from a FADEC channel A.

18. The filtering algorithm as recited in claim 1, wherein the electronic engine control (EEC) unit comprises, in electronic communication, a processor, a memory, and an interface, the memory storing the filter algorithm.

19. The filtering algorithm as recited in claim 1, wherein the division function, the first comparator function, the second comparator function, and the or gate constitute a computer program operated by the electronic engine control (EEC) unit.

* * * * *